(12) United States Patent  
Wang

(10) Patent No.: US 6,674,290 B2  
(45) Date of Patent: Jan. 6, 2004

(54) METHOD AND SYSTEM FOR MULTI-PORT SYNCHRONOUS HIGH VOLTAGE TESTING

(75) Inventor: Simon Wang, Taipei (TW)

(73) Assignee: Chroma ATE Inc., Taipei (TW)

( * ) Notice: Subject to any disclaimer, the term of this patent is extended or adjusted under 35 U.S.C. 154(b) by 74 days.

(21) Appl. No.: 10/055,701

(22) Filed: Jan. 22, 2002

(65) Prior Publication Data

US 2003/0137308 A1 Jul. 24, 2003

(51) Int. Cl.$^7$ .................. G01R 37/14; G01R 31/08; G01R 31/28
(52) U.S. Cl. .................. 324/511; 324/512; 324/522; 324/523; 324/527; 324/528; 324/529
(58) Field of Search .................. 324/511, 512, 324/522, 523, 527, 528, 529, 530, 772, 546, 547, 540, 551

(56) References Cited

U.S. PATENT DOCUMENTS

| | | | | |
|---|---|---|---|---|
| 3,754,221 A | * | 8/1973 | Stelter | 340/651 |
| 3,913,010 A | * | 10/1975 | Scarpino | 324/509 |
| 3,934,176 A | * | 1/1976 | Vasudevan et al. | 361/48 |
| 4,209,741 A | * | 6/1980 | Coby et al. | 324/713 |
| 4,542,302 A | * | 9/1985 | Griffioen | 307/326 |
| 5,729,145 A | * | 3/1998 | Blades | 324/536 |
| 5,796,259 A | * | 8/1998 | Dickmander | 324/524 |
| 5,995,588 A | * | 11/1999 | Crick | 379/22 |
| 6,265,881 B1 | * | 7/2001 | Meliopoulos et al. | 324/691 |

* cited by examiner

Primary Examiner—Andrew H. Hirshfeld
Assistant Examiner—Wasseem M. Hamdan
(74) Attorney, Agent, or Firm—Bucknam and Archer

(57) ABSTRACT

The invention disclosed a method and system for multi-port synchronous high voltage testing, which mainly uses two or more sets of testing circuit with variable output condition and a high voltage generator with zero intermediate voltage for synchronous high voltage testing. Therefore it is not only possible to prevent operators from electric shock but also to provide correct multi-port testing voltages so as not to cause object under test damage. The testing circuit uses a plurality sets of individual high voltage generator and a current detector for providing functions for reading and determining individual voltage and current, so that it is possible to perform several high voltage tests during a single test period and complete tests on electric products. It is therefore possible to achieve both reduction of test-time and safety of operators.

6 Claims, 2 Drawing Sheets

METHOD AND SYSTEM FOR MULTI-PORT SYNCHRONOUS HIGH VOLTAGE TESTING

BACKGROUND OF THE INVENTION

1. Field of the Invention

The present invention relates to a method and system for multi-port synchronous high voltage testing, especially to a method and system using two or more independent high voltage generator to perform multi-port high voltage testing on an object under test.

2. Description of the Prior Art

Refer to FIG. 1, FIG. 1 is a block diagram showing a conventional test system for multi-port high voltage scanning, which comprises a high voltage generator 12 and a current detector 13. At present, when manufacturers perform a high voltage testing on electric parts or products, if the object has a primary portion 21, a case 22, and secondary portion 23, wherein the potentials of the secondary portion 23 and the case 22 are different, the primary portion 21 will be requested to be tested in high voltage to the secondary portion 23, high voltage turned out at floated case 22 frequently put operators under risk of electric shock by exposure to case 22. At the same time, the floating voltage of case 22 resulted from the voltage division effect of internal impedances for the primary portion-to-case and the case-to-secondary portion frequently cause electric products damage due to poor withstand voltage caused by the different designing conditions.

Furthermore, the conventional multi-port high voltage scanning test system 1 needs to use high voltage switching circuit 11 to perform high voltage testing of the primary portion-to-case, the secondary portion-to-case, and the primary portion to the secondary portion. Therefore, at least three tests are necessary to complete tests on objects under test, the total test is difficult to control total test time required.

Seeing the inefficiency of testing via conventional system awaiting urgent improvement, the inventor has invested prolong thinking and research effort on the subject and finally developed the method and system for multi-port synchronous high voltage testing.

SUMMARY OF THE INVENTION

An object of present invention is to provide a method and system for multi-port synchronous high voltage testing, so that it is possible to prevent operators from electric shock caused by unintentionally touching floating ground of the tested object during high voltage testing and to ensure the safety of the operator. Another object of present invention is to provide a method and system for multi-port synchronous high voltage testing, so that it is possible to prevent the electric product from poor withstand voltage caused by voltage division effect of conditional voltage distribution during a floating test.

Yet another object of present invention is to provide a method and system for multi-port synchronous high voltage testing, so that it is possible to complete a three-time high voltage testing in a single test period via a synchronous testing, and the test time is effectively reduced to one third of that required in prior art.

A method and system for multi-port synchronous high voltage testing, which mainly uses two or more sets of testing circuit with variable output condition and a high voltage generator with zero intermediate voltage for synchronous high voltage testing, wherein said testing circuit comprises a plurality sets of individual high voltage generator and a current detector for providing functions for reading and determining individual voltage and current, so that it is possible to perform several high voltage tests during a single test period and complete the product test.

DETAILED DESCRIPTION OF THE INVENTION

Refer to FIG. 2, FIG. 2 is a block diagram showing a circuit for multi-port synchronous high voltage testing 3 according to the present invention. The present invention uses two independent sets of high voltage generator as voltage controlling output devices, wherein the intermediate voltage between high voltage generator A 31 and current detector A 32 and between high voltage generator B 34 and current detector B 35 are of compulsory zero-volt, so that it is possible to ensure the safety of operators. In AC mode, said two independent sets of high voltage generator have a feature of independently and individually controlled voltage magnitude and opposite phases, i.e. a phase difference of 180 degree; while in DC mode, said two independent sets of high voltage generator have a feature of independently and individually controlled voltage magnitudes and positive and negative voltage outputs respectively, i.e. one voltage with polarity opposite to the other.

In order to improve consecutive multi-time testing in prior art for simultaneous multi-port testing, the present invention has change of the output conditions: a primary loop with independent voltage V1 consisted of a high voltage generator A 31, a current detector A 32, and a primary portion 33 of object under test; a secondary loop with independent voltage V2 consisted of a high voltage generator B 34, a current detector B 35, and a secondary portion 36 of object under test; a zero-potential loop with independent voltage V3 which is a loop from product case 37 to zero-potential (intermediate voltage); such that except the function of the high voltage generator, in AC mode, the current detector detects current flow through object under test, due to high voltage generator A 31 and high voltage generator B 34 opposite in phase, the current detector synchronously detect current flow from high voltage generator B 34 via object under test to high voltage generator A 31, thus in case of having independent voltage in each loop, both current reading and determining may fulfill the safety specification in tests request for independent voltage and current reading and determination.

Therefore as described above, when performing high voltage testing on electric parts or products equipped with primary portion, case, and secondary portion for the secondary portion and the case of different potentials, said circuit may complete three high voltage testing of primary-to-case, secondary-to-case, and primary-to-secondary on electric product or tested object within a single test period.

For further emphasize, said testing circuit uses a plurality sets of high voltage generators and a current detector to provide functions for reading and determining of independent voltage and current, so as to perform several high voltage tests during a single test period, while reducing test time and protecting operators.

FEATURES AND EFFECTS

The present invention has provided a circuit for multi-port synchronous high voltage testing with the following advantages:

1. To ensure that tested product has no poor withstand voltage caused by voltage division.

2. To effectively save test time for manufacturer seriously about shipment schedule to have absolute controllability.
3. To provide a technique that is not familiar to those skilled in prior art but very inventive.

To summary from above, the present invention is an unpublic novel technique with industry applicability and improvement, which can comply with the criteria specification of patent law.

However, above mentioned is simply a preferred embodiment that is not intended to be the limit of the invention, and various change, equivalence and modification without departing from the claim must be considered within the scope and spirit of the invention.

Figure 1:
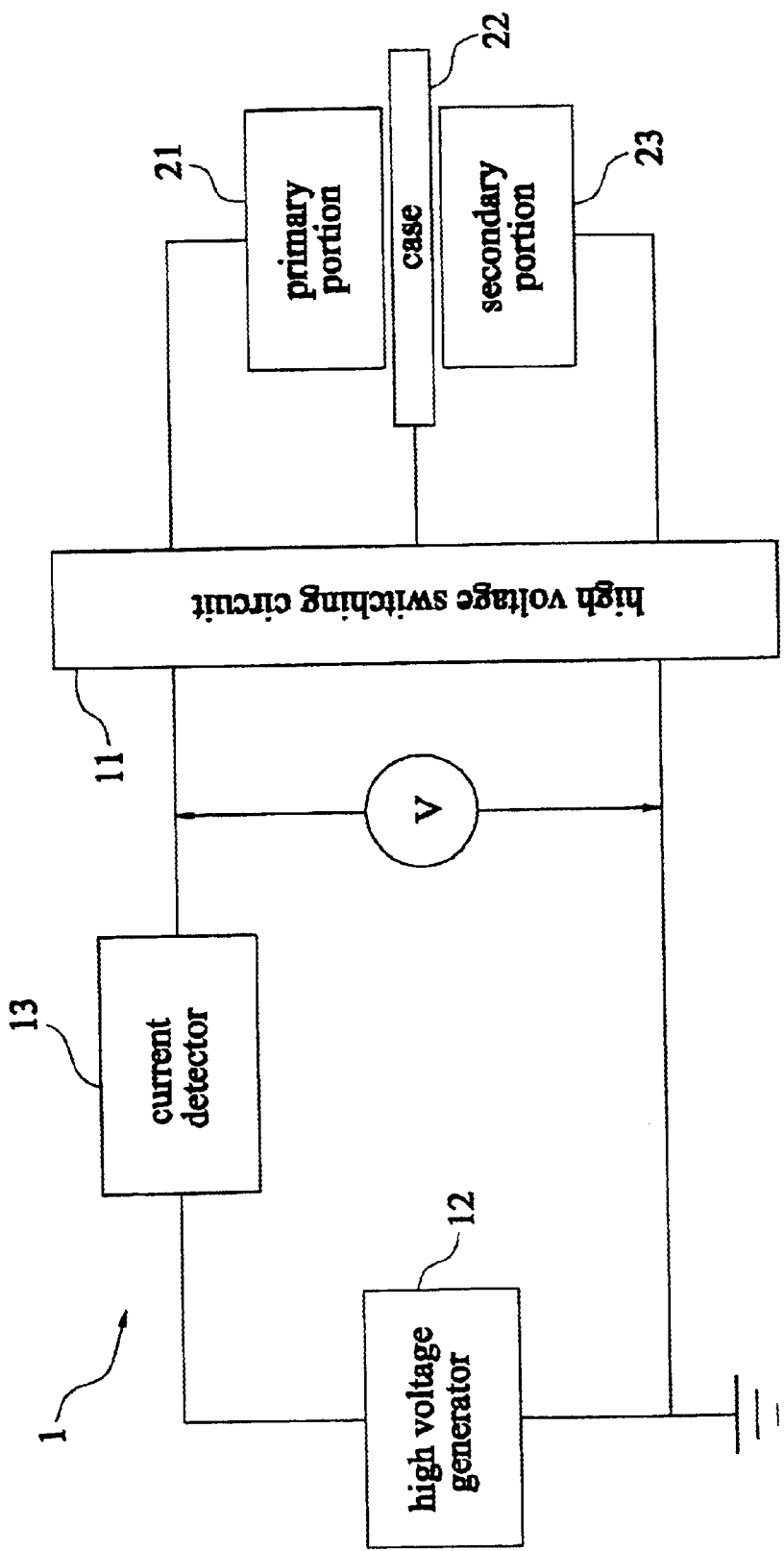
FIG. 1 is a block diagram showing a conventional circuit for high voltage testing.
Figure 2:
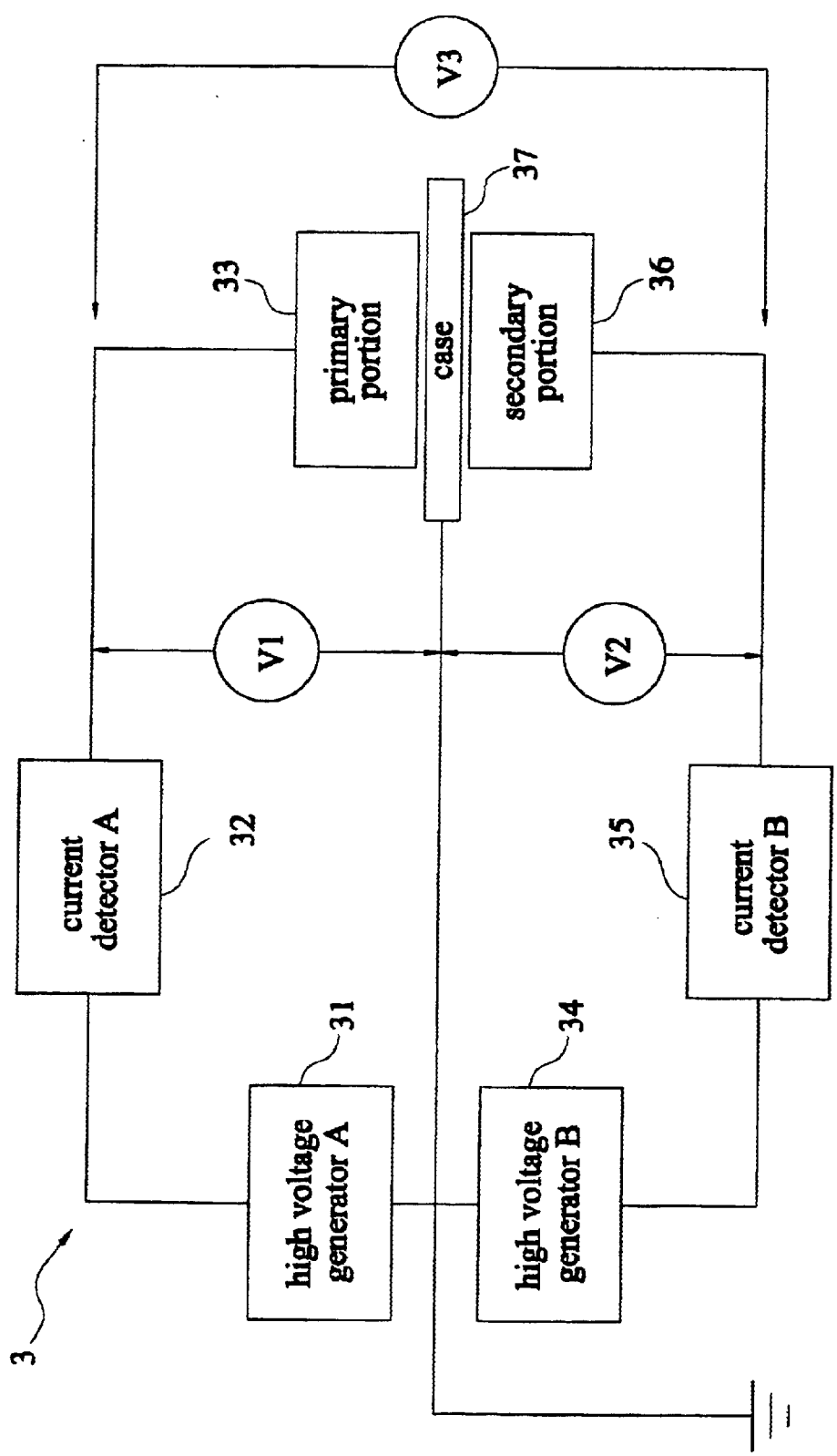
FIG. 2 is a block diagram showing a circuit for multi-port synchronous high voltage testing in accordance with present invention.

DESCRIPTION OF SYMBOL 1 conventional circuit for multi-port scanning system of high voltage testing
3 circuit for multi-port synchronous high voltage testing
11 high voltage switching circuit
12 high voltage generator
13 current detector
21 primary portion
22 case
23 secondary portion
31 high voltage generator A
32 current detector A
33 primary portion
34 high voltage generator B
35 current detector B
36 secondary portion
37 product case

What we claimed is:

1. A circuit for multi-port synchronous high voltage testing, comprising: a primary loop, composed of a high voltage generator, a current detector, and a primary portion of a tested object for providing an independent voltage V1; a secondary loop, composed of a high voltage generator, a current detector, and a secondary portion of the tested object for providing an independent voltage V2; a zero-potential loop, which is a loop from product case to intermediate voltage; wherein by using a formation of each said loops to synchronously provide three high voltage testing on primary-to-case, secondary-to-case, and primary-to-secondary, and complete current testing with the safety specification fulfilled.

2. The circuit for multi-port synchronous high voltage testing according to claim 1, wherein said two independent sets of high voltage generators have in AC mode a feature of independently and individually controlled voltage magnitudes and opposite phases, i.e. a phase difference of 180 degree.

3. The circuit for multi-port synchronous high voltage testing according to claim 1, wherein said two independent sets of high voltage generator have in DC mode a feature of independently and individually controlled voltage magnitude and positive and negative voltage output respectively, i.e. one voltage with opposite polarity to the other.

4. The circuit for multi-port synchronous high voltage testing according to claim 1, wherein said current detector detects a current flow through the tested object, due to said high voltage generator (A31) and said high voltage generator (B34) opposite in phase, said current detector simultaneously detects current flow from said high voltage generator (B34) to said high voltage generator (A31) via the tested object.

5. The circuit for multi-port synchronous high voltage testing according to claim 1, wherein in case of having independent voltage in each loop, both current reading and determination can fulfil the safety specification in tests request for independent voltage and current reading and determination.

6. A method for multi-port synchronous high voltage testing, characterized in that:

providing an independent voltage (V1) across a primary loop consisting of a high voltage generator (A 31), a current detector (A32), and a primary portion (33) of a tested object;

providing an independent voltage (V2) across a secondary loop consisting of a high voltage generator (B 34), a current detector (B 35), and a secondary portion (36) of the tested object;

providing an independent voltage (V3) across a zero-potential loop which is a loop from a product case (37) to zero-potential, whereby, having independent voltage in each loop, the formation of each said loops synchronously provide three high voltage testing on primary-to-case, secondary-to-case, and primary-to-secondary; and completing current testing so that a safety specification is fulfilled.

* * * * *